US010871843B2

(12) United States Patent
Ma et al.

(10) Patent No.: US 10,871,843 B2
(45) Date of Patent: Dec. 22, 2020

(54) BONDING AREA STRUCTURE, METHOD OF MANUFACTURING THE SAME, PANEL AND TOUCH DISPLAY DEVICE (71) Applicants: Hefei Xinsheng Optoelectronics Technology Co., Ltd., Anhui (CN); BOE Technology Group Co., Ltd., Beijing (CN)

(72) Inventors: Li Ma, Beijing (CN); Yichuan Tan, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/316,531

(22) PCT Filed: Feb. 9, 2018

(86) PCT No.: PCT/CN2018/076033
§ 371 (c)(1),
(2) Date: Jan. 9, 2019

(87) PCT Pub. No.: WO2018/161781
PCT Pub. Date: Sep. 13, 2018

(65) Prior Publication Data
US 2019/0235680 A1    Aug. 1, 2019

(30) Foreign Application Priority Data
Mar. 6, 2017    (CN) .................... 2017 2 0211529 U (51) Int. Cl.
*G06F 3/041*    (2006.01)
*G06F 3/044*    (2006.01)
(Continued)

(52) U.S. Cl.
CPC .......... *G06F 3/0412* (2013.01); *G02F 1/1343* (2013.01); *G02F 1/13338* (2013.01);
(Continued)

(58) Field of Classification Search
CPC ........... G02F 1/13338; G02F 1/136286; G02F 1/133512; G02F 1/1333; G02F 1/13439;
(Continued)

(56) References Cited

U.S. PATENT DOCUMENTS 9,658,709 B2* 5/2017 Hsu ...................... G06F 3/0412
9,872,400 B2* 1/2018 Chang ..................... G06F 3/044
(Continued)

FOREIGN PATENT DOCUMENTS

CN    104461157 A    3/2015
CN    104571764 A    4/2015
(Continued)

OTHER PUBLICATIONS

International Search Report (including English translation) and Written Opinion (including English translation of Box V) for International Patent Application No. PCT/CN2018/076033, dated May 14, 2018, 16 pages.

*Primary Examiner* — Dismery Mercedes
(74) *Attorney, Agent, or Firm* — Westman, Champlin & Koehler, P.A.

(57) ABSTRACT

A bonding area structure and a method of manufacturing the same, a panel and a touch display device are provided, the bonding area structure includes a substrate; a light blocking layer on a surface of the substrate; a patterned electrode on a side of the light blocking layer away from the substrate; a metal connection portion on a surface of the patterned electrode away from the light blocking layer for bonding with an external circuit; and an etch barrier on a side of the light blocking layer away from the substrate and at least in
(Continued)

a region where no patterned electrode is disposed so as to cover a portion of the light blocking layer exposed by the patterned electrode.

13 Claims, 4 Drawing Sheets

(51) Int. Cl.
  *G02F 1/1333* (2006.01)
  *H05K 3/06* (2006.01)
  *G03F 7/16* (2006.01)
  *G02F 1/1343* (2006.01)
  *G02F 1/1339* (2006.01)
  *G02F 1/1335* (2006.01)

(52) U.S. Cl.
  CPC .... *G02F 1/13394* (2013.01); *G02F 1/133512* (2013.01); *G03F 7/16* (2013.01); *G06F 3/041* (2013.01); *G06F 3/044* (2013.01); *H05K 3/064* (2013.01); *G06F 2203/04103* (2013.01)

(58) Field of Classification Search
  CPC ............ G02F 1/1343; G02F 1/133345; G02F 1/13394; G02F 2201/50; G02F 2201/133792; G02F 2201/13396; H01L 29/78633; H01L 27/323; H01L 27/3258; H01L 27/3272; H01L 51/5253; G06F 2203/04103; G06F 2203/04112; G06F 3/0412; G06F 3/041; G06F 3/044; G06F 3/0445; H05K 3/064
  See application file for complete search history.

(56) References Cited

U.S. PATENT DOCUMENTS

| | | | |
|---|---|---|---|
| 10,198,134 B2* | 2/2019 | Du | G06F 3/044 |
| 2014/0078691 A1* | 3/2014 | Huang | H05K 1/0268 361/749 |
| 2014/0184940 A1* | 7/2014 | Ma | G06F 3/0412 349/12 |
| 2014/0240616 A1* | 8/2014 | Huang | H05K 3/107 349/12 |
| 2015/0047885 A1* | 2/2015 | Chang | H05K 3/02 174/257 |
| 2015/0169098 A1* | 6/2015 | Li | G06F 3/044 345/173 |
| 2015/0261370 A1* | 9/2015 | Yoo | G06F 3/044 345/173 |
| 2015/0370395 A1* | 12/2015 | Hsu | G06F 3/0412 345/174 |
| 2016/0077637 A1* | 3/2016 | Weaver | G06F 3/0446 345/174 |
| 2016/0291735 A1* | 10/2016 | Nakanishi | G06F 3/044 |
| 2016/0364041 A1 | 12/2016 | He et al. | |
| 2016/0370923 A1* | 12/2016 | Ma | G06F 3/041 |
| 2017/0017319 A1* | 1/2017 | Du | G06F 3/044 |
| 2017/0177127 A1* | 6/2017 | Du | G06F 3/0446 |
| 2018/0143707 A1* | 5/2018 | Shi | G06F 3/0412 |
| 2018/0341348 A1* | 11/2018 | Zeng | G06F 3/044 |
| 2019/0056825 A1* | 2/2019 | Lin | G06F 3/044 |
| 2019/0171103 A1* | 6/2019 | Shimoyama | G03F 7/2037 |
| 2019/0384428 A1* | 12/2019 | Ahn | G06F 3/0443 |

FOREIGN PATENT DOCUMENTS

| | | |
|---|---|---|
| CN | 104635991 A | 5/2015 |
| CN | 204537091 U | 8/2015 |
| CN | 206505399 U | 9/2017 |

* cited by examiner

BONDING AREA STRUCTURE, METHOD OF MANUFACTURING THE SAME, PANEL AND TOUCH DISPLAY DEVICE

CROSS-REFERENCE TO RELATED APPLICATION

This application is a Section 371 National Stage Application of International Application No. PCT/CN2018/076033, filed on Feb. 9, 2018. This application claims the benefit of Chinese Patent Application No. 201720211529.7 filed on Mar. 6, 2017 in the State Intellectual Property Office of China, the disclosures of which are incorporated herein by reference.

TECHNICAL FIELD

The present disclosure relates to the field of display technology, and in particular, to a bonding area structure and a method of manufacturing the same, a panel and a touch display device.

BACKGROUND

With the development of display technology, touch technology is increasingly used in electronic devices such as mobile phones, tablet computers, etc. for display and human-computer interaction. At present, a widely used application is to integrate a touch technology into a liquid crystal display device or an organic light emitting display device to fabricate a touch display device.

However, the structure and manufacturing process of current touch display devices still need to be improved.

SUMMARY

One of the objectives of the present disclosure is to provide a bonding area structure, a manufacturing method thereof, a panel, and a touch display device.

An embodiment of the present disclosure provides a bonding area structure, comprising: a substrate; a light blocking layer on a surface of the substrate; a patterned electrode on a side of the light blocking layer away from the substrate; a metal connection portion on a surface of the patterned electrode away from the light blocking layer for bonding with an external circuit; and an etch barrier on a side of the light blocking layer away from the substrate and at least in a region where no patterned electrode is disposed so as to cover a portion of the light blocking layer exposed by the patterned electrode.

In some embodiments, a height of the etch barrier is greater than a height of the patterned electrode adjacent to the etch barrier.

In some embodiments, the metal connection portion exposes at least a portion of the patterned electrode to form a step between the metal connection portion and the patterned electrode, and the etch barrier covers the step.

In some embodiments, a top surface of the etch barrier is flush with a top surface of the metal connection portion.

In some embodiments, the etch barrier is formed of photoresist.

In some embodiments, the patterned electrode is a transparent electrode.

An embodiment of the present disclosure provides a panel comprising the bonding area structure according to the above embodiments, wherein the panel comprises an intermediate region and a peripheral region, and the bonding area structure is located in the peripheral region.

In some embodiments, the panel is a touch panel comprising a touch electrode, and the patterned electrode and the touch electrode are disposed in the same layer and formed of the same material.

In some embodiments, a top surface of the etch barrier is higher than a top surface of the metal connection portion.

In some embodiments, a difference between the height of the etch barrier and the sum of the height of the patterned electrode and a height of the metal connection portion does not exceed 7% of the height of the metal connection portion.

In some embodiments, the transparent electrode comprises ITO.

In some embodiments, the transparent electrode comprises a metal mesh.

An embodiment of the present disclosure provides a touch display device comprising the panel according to the above embodiments.

An embodiment of the present disclosure provides a method of manufacturing a bonding area structure, comprising: coating a substrate with a light shielding material to form a light blocking layer; depositing a conductive layer on a side of the light blocking layer away from the substrate, and forming a patterned electrode by a first patterning process; depositing a metal layer on the substrate on which the patterned electrode is formed, and forming a metal connection portion disposed on the patterned electrode by a second patterning process; and coating the substrate on which the metal connection portion is formed with photoresist, and forming an etch barrier on a side of the light blocking layer away from the substrate and in a region where no patterned electrode is disposed by a third patterning process, the etch barrier covering at least a portion of the light blocking layer exposed by the patterned electrode.

An embodiment of the present disclosure provides a method of manufacturing a bonding area structure, comprising: coating a substrate with a light shielding material to form a light blocking layer; depositing a conductive layer and a metal layer on a side of the light blocking layer away from the substrate in sequence, and forming a patterned electrode and a metal connection portion disposed on the patterned electrode by a single patterning process; and coating the substrate on which the metal connection portion is formed with photoresist, and forming an etch barrier on a side of the light blocking layer away from the substrate and in a region where no patterned electrode is disposed by a third patterning process, the etch barrier covering at least a portion of the light blocking layer exposed by the patterned electrode. In some embodiments, the bonding area structure is located in a peripheral region of a panel including an intermediate region and the peripheral region, the method further comprises: coating the entire panel including the bonding area structure with an index matching layer; and removing a portion of the index matching layer on the bonding area structure by a fourth patterning process to expose the metal connection portion.

BRIEF DESCRIPTION OF THE DRAWINGS

The above and/or additional aspects and advantages of the present disclosure will become apparent and readily understood in the description of embodiments in conjunction with the accompanying drawings, in which.

DETAILED DESCRIPTION OF THE EMBODIMENTS

The embodiments of the present disclosure are described in detail below, and the examples of the embodiments are illustrated in the drawings, wherein the same or similar reference numerals indicate the same or similar elements or elements having the same or similar functions. The embodiments described below with reference to the accompanying drawings are illustrative, they are intended to explain the present disclosure only, and are not to be construed as limiting the present disclosure.

In the description of the present disclosure, the orientations or positional relationships indicated by the terms "upper", "lower" and the like are based on the orientations or positional relationships shown in the drawings, they are only for the convenience of describing the present disclosure and does not require that the present disclosure be constructed and operated in a specific orientation. Thus they are not to be construed as limiting the disclosure.

The present disclosure is based on the following findings of the inventor:

At present, panels for manufacturing touch display devices, such as display panels or touch panels, generally have defects such as long preparation cycle, low product yield, and high production cost and the like. After intensive research and a large number of experiments, the inventor found that in the production of the above panels, it is necessary to use screen printing technology and etch away part of the index matching layer to expose the metal connection portion (bonding pad) of the circuit structure in the panel so as to realize the connection between an internal circuit of the panel and IC or flexible circuit board (FPC) or the like. However, there are many manual participations in the screen printing technology, usually the yield loss is large at this step, and the production efficiency is low. The inventors have found through in-depth research that: the screen printing technology needs to be controlled to expose only the metal connection portion (bonding pad) in the circuit structure for connection, and a structure other than the metal connection portion (bonding pad), such as a light blocking layer disposed in the non-display area or non-touch area of the panel for preventing light leakage, should not be etched. Therefore, the required precision of the etching is high, and manual adjustment is required, thereby causing a decrease in production efficiency. On the other hand, when the etching precision is not well controlled, it is easy to cause excessive etching to damage structures such as a light blocking layer, resulting in poor light transmission in the bonding area where the metal connection portion is located. When the etching is insufficient, the metal connection portion (bonding pad) is not well exposed, and residual of the index matching layer remains, resulting in an unclean etching and a risk of contamination.

Figure 1:
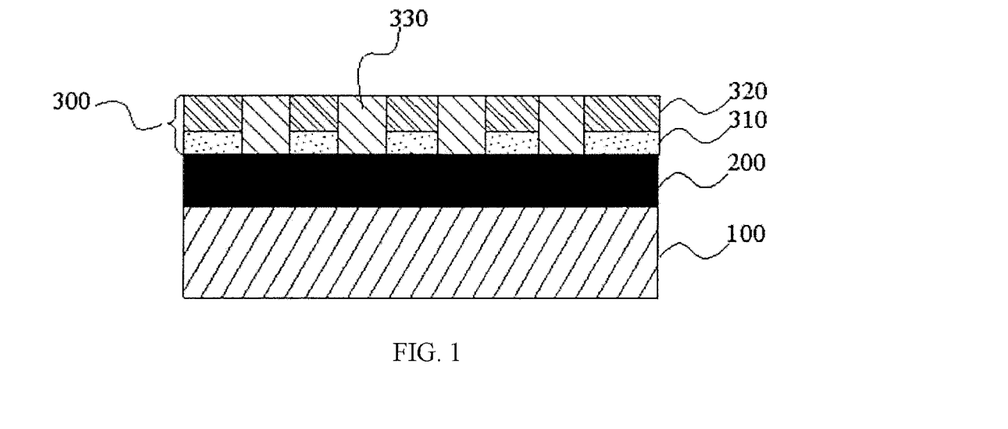
FIG. 1 shows a cross-sectional view of a bonding area structure according to an embodiment of the present disclosure.

In one aspect of the present disclosure, the present disclosure provides a bonding area structure that is part of a panel. The panel includes an intermediate region and a peripheral region surrounding the intermediate region, and the bonding area structure is generally located in the peripheral region of the panel. According to embodiments of the present disclosure, FIG. 1 shows a cross-sectional view of a bonding area structure according to an embodiment of the present disclosure. As shown in FIG. 1, the bonding area structure includes a substrate 100, a light blocking layer 200, and an electrode layer 300. The light blocking layer 200 is disposed on the substrate 100, and the electrode layer 300 is disposed on a surface of the light blocking layer 200 away from the substrate 100. The electrode layer 300 includes a patterned electrode 310 and a metal connection portion 320. The patterned electrode 310 is disposed on the surface of the light blocking layer 200 away from the substrate 100 and is formed by a patterning process, and may be a hollow pattern. The metal connection portion 320 is disposed on a surface of an electrode region of the patterned electrode 310 away from the light blocking layer 200 for bonding with an external circuit so as to realize electrical connection between the patterned electrode 310 and the external circuit or IC. By adopting the structure of the patterned electrode 310, the amount of metal or conductive material required for forming the electrode can be reduced, which is advantageous for cost saving. According to the embodiment of the present disclosure, an etch barrier 330 is disposed at least in a region of the light blocking layer 200 where no patterned electrode 310 is disposed. The etch barrier 330 covers a portion of the light blocking layer 200 exposed by the patterned electrode 310. Therefore, in a process of etching an index matching layer on the bonding area structure which is used for manufacturing the panel, by providing the etch barrier 330, it is possible to prevent overetching due to poor control of the etching precision, and to avoid light leakage in the peripheral region where the bonding area structure is located due to damage to the light blocking layer 200, and to avoid damage to the patterned electrode 310. By providing the etch barrier 330, the process margin of the process of etching the index matching layer can be improved, and the contamination of the metal connection portion 320 or the patterned electrode 310 caused by incomplete etching of index matching material can be avoided. As a result, product yield can be improved and production cost can be reduced.

The various components and/or structures of the bonding area structure are described in detail below in conjunction with specific embodiments of the present disclosure.

Figure 2:
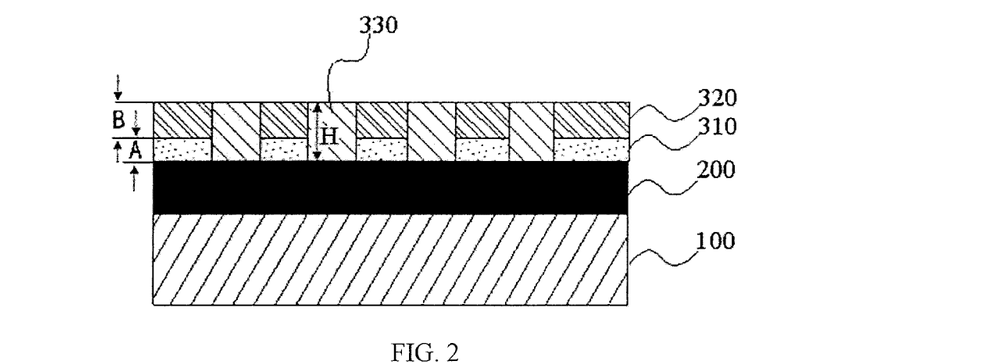
FIG. 2 shows a cross-sectional view of a bonding area structure according to an embodiment of the present disclosure.

According to an embodiment of the present disclosure, a height of the etch barrier 330 is generally higher than a height of the patterned electrode 310 as long as the overetching can be prevented and the portion of the light-blocking layer 200 exposed by the patterned electrode 310 and the patterned electrode 310 itself are not damaged. For example, according to an embodiment of the present disclosure, as shown in FIG. 2, the height H of the etch barrier 330 may be substantially equal to the sum of the height A of the patterned electrode 310 and the height B of the metal connection portion 320 which are both adjacent to the etch barrier 330, or may be larger or smaller than the sum of the height A of the patterned electrode 310 and the height B of the metal connection portion 320 which are both adjacent to the etch barrier 330. According to an embodiment of the present disclosure, when the height of the etch barrier 330 is smaller than the sum of the height A of the patterned electrode 310 and the height B of the metal connection portion 320, it is necessary to ensure that the height of the etch barrier 330 is larger than the height A of the patterned electrode 310 adjacent to the etch barrier 330, that is, a top surface of the etch barrier 330 is located between a top surface of the patterned electrode 310 and a top surface of the metal connection portion 320 on the patterned electrode 310. Therefore, the patterned electrode 310 can be beneficially protected from damage during the etching process. When the height H of the etch barrier 330 is greater than the sum of the height A of the patterned electrode 310 and the height B of the metal connection portion 320, in order to ensure that the panel may have a relatively flat surface, the height of the etch barrier 330 is greater than the sum of the height of the patterned electrode 310 and the height of the metal connection portion 320 by a height that is substantially less than or equal to 7% of the height B of the metal connection portion 320.

According to an embodiment of the present disclosure, the height of the etch barrier 330 may be equal to the sum of the heights of the patterned electrode 310 and the metal connection 320 adjacent to the etch barrier 330. Since the etch barrier 330 is disposed in a region, where the patterned electrode 310 is not disposed, on the light blocking layer 200, the etch barrier 330 is in contact with the entire sidewall of the patterned electrode 310, and is also in contact with the entire sidewall of the metal connection 320 on the patterned electrode 310. FIG. 2 illustrates a cross-sectional view of a bonding area structure according to an embodiment of the present disclosure, as shown in FIG. 2, the height H of the etch barrier 330 is equal to the sum of the height A of the patterned electrode 310 and the height B of the metal connection portion 320 which are both in contact with the etch barrier 330. In other words, a top surface of the etch barrier 330 is in the same horizontal plane as a top surface of the metal connection portion 320. Thereby, it is possible to prevent the height of the etch barrier 330 from being too large, which affects the flatness of the panel, so as to further improve the product yield.

Figure 3:
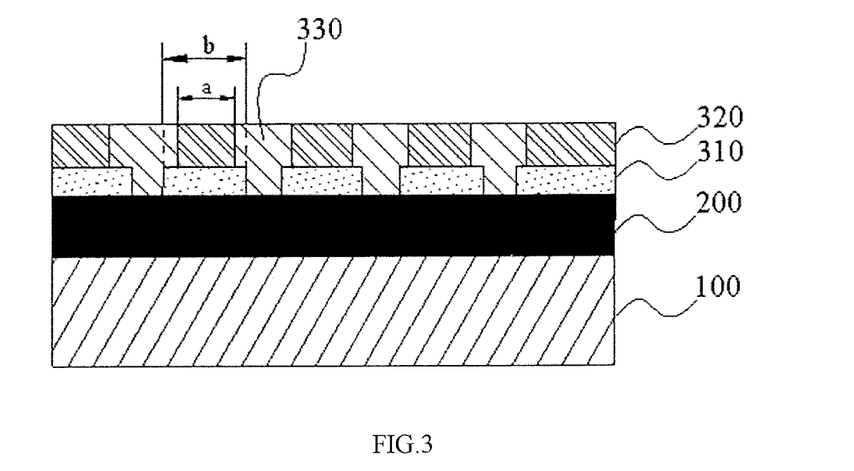
FIG. 3 shows a cross-sectional view of a bonding area structure according to an embodiment of the present disclosure.

It can be understood by those skilled in the art that the metal connection portion 320 is used to realize the electrical connection between the patterned electrode 310 and the external circuit. Therefore, the metal connection portion 320 may not cover the entire upper surface of the patterned electrode 310, and may be disposed in a region where electrical connection is required. According to an embodiment of the present disclosure, at a position where the patterned electrode 310 needs to be connected to the external circuit, the metal connection portion 320 may also cover a portion of a surface of the patterned electrode 310. FIG. 3 illustrates a cross-sectional view of a bonding area structure according to an embodiment of the present disclosure, as shown in FIG. 3, the metal connection portion 320 covers only the portion of the surface of the patterned electrode 310, such that a step may be provided between the metal connection portion 320 and the patterned electrode 310, and the step is formed by the metal connection portion 320 exposing at least a portion of the top surface of the patterned electrode 310. Thereby, the amount of metal required to form the metal connection portion 320 may be further reduced, and the cost may be further saved. According to an embodiment of the present disclosure, the etch barrier 330 covers the step, and a surface of the patterned electrode 310 exposed by the metal connection portion 320 at the step may be protected from being excessively etched to be damaged or contaminated, and the light blocking layer 200 below the step may be protected from being excessively etched to be damaged, thereby avoiding light leakage. As described above, the metal connection portion 320 is used for the electrical connection with an external circuit or IC, therefore, when the electrical connection between the patterned electrode 310 and the external circuit or IC is realized by the metal connection portion 320, the metal connection portion 320 in the bonding area structure of the panel needs to be exposed. In the case, the etch barrier 330 may cover and protect the surface of the patterned electrode 310 at the step described above by using a patterning process. It should be noted that, in the present disclosure, the term "step" specifically means that a length a of a longitudinal section of the metal connection portion 320 is smaller than a length b of a longitudinal section of the patterned electrode 310 electrically connected to the metal connection portion 320, in this case, at least a portion of the top surface of the patterned electrode 310 is not covered by the metal connection portion 320. The specific number and size of the steps are not particularly limited, and they may be adjusted by those skilled in the art according to actual conditions. For example, on the same patterned electrode 310, there may be one step or two steps. When there are two steps on the patterned electrode 310, two steps may be respectively located on both sides of the top surface of the patterned electrode 310.

Figure 4:
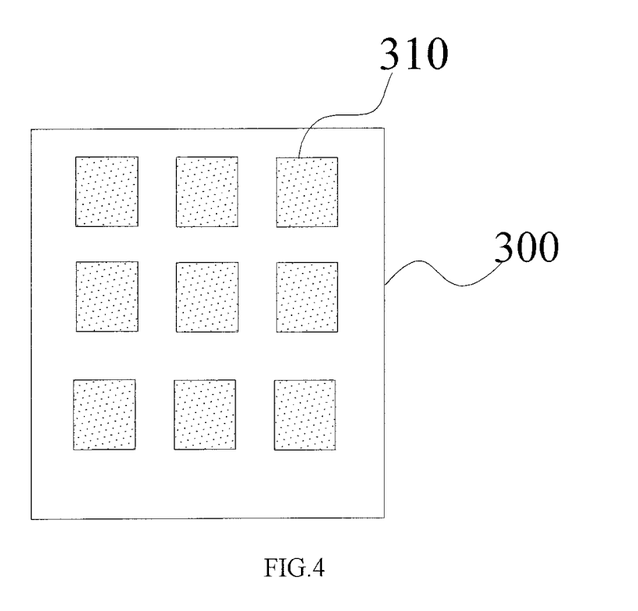
FIG. 4 shows a top view of a patterned electrode of a bonding area structure according to an embodiment of the present disclosure.
Figure 5:
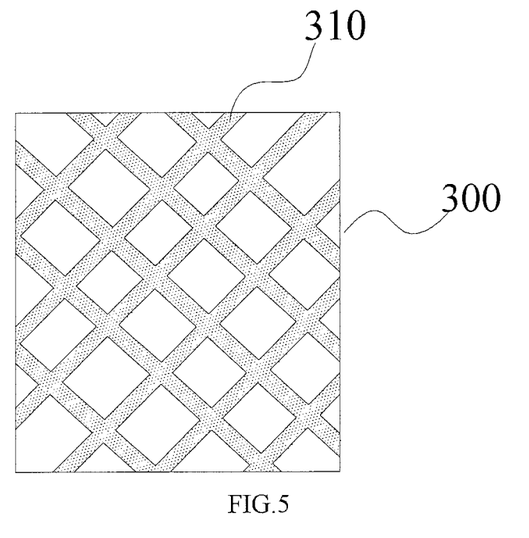
FIG. 5 shows a top view of a patterned electrode of a bonding area structure according to another embodiment of the present disclosure.

It should be noted that the specific material for forming the patterned electrode 310 is not particularly limited. According to an embodiment of the present disclosure, the patterned electrode 310 may be made of a transparent conductive material such as ITO or ZnO or the like, among them, the ITO has good light transmittance. The patterned electrode 310 is formed by using ITO, which is beneficial to improving the light transmittance of the panel. Further, the ITO has high conductivity and mature preparation technology, thereby improving product yield and reducing production cost. In addition, those skilled in the art may form the patterned electrode 310 by using a metal mesh according to actual needs. The raw material required for the preparation of the metal mesh is inexpensive and the cost can be further saved. The specific shape of the patterned electrode 310 is also not particularly limited according to an embodiment of the present disclosure. FIG. 4 illustrates a top view of a patterned electrode of a bonding area structure according to an embodiment of the present disclosure. As shown in FIG. 4, the patterned electrode 310 may include a plurality of isolated structures, such as a plurality of isolated rectangular structures. FIG. 5 shows a top view of a patterned electrode of a bonding area structure according to another embodiment of the present disclosure. As shown in FIG. 5, the patterned electrode 310 may also be formed by electrode wires or electrode strips connected to each other and having a certain width. The above electrode wires or electrode strips constitute a predetermined pattern, for example, forming the mesh structure shown in FIG. 5.

According to an embodiment of the present disclosure, the specific type of the panel including the above-mentioned bonding area structure is not particularly limited, and the panel may be a touch panel, a color film substrate or an array substrate. When the panel is a touch panel, the patterned electrode 310 and a touch electrode are formed in the same layer by the same material using the same patterning process. When the panel is an array substrate, the substrate 100 may further have a structure such as a thin film transistor and the like. In this case, the patterned electrode 310 may be any electrode structure on the array substrate that needs to be connected to the external circuit.

According to an embodiment of the present disclosure, the material for forming the etch barrier 330 is not particularly limited as long as the etch barrier 330 formed by the material does not react with the etchant used in the subsequent process, where the index matching layer is etched, and can protect the patterned metal 310 and the light blocking layer 200. For example, the etch barrier 330 is formed of a photoresist such as OCR (Over Coating Resist). It can be understood by those skilled in the art that the patterned electrode 310 in the above electrode layer 300 can be formed by first depositing a conductive layer, such as an ITO layer, and then providing a photolithography mask and using a patterning process. The etch barrier 330 is formed by using a photoresist. On the one hand, the etch barrier 330 may be patterned by using only the exposure and development technology, and the etching step may be omitted compared with using other materials to form the etch barrier, thereby saving raw materials; on the other hand, the height of the etch barrier 330 can be easily controlled by a photoresist coating process. As a result, the production cost can be reduced, thereby facilitating the promotion and large-scale utilization of the bonding area structure and the panel including the bonding are structure.

Figure 6:
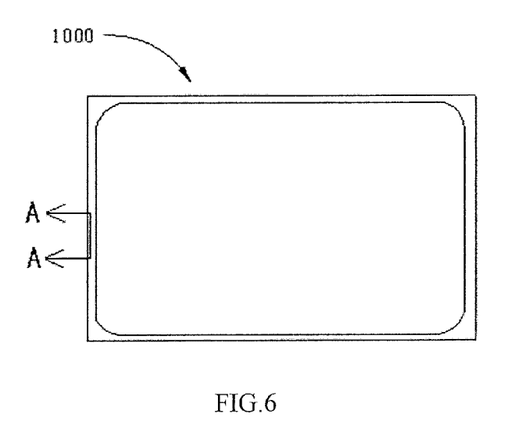
FIG. 6 shows a schematic structural view of a panel according to an embodiment of the present disclosure.
Figure 7:
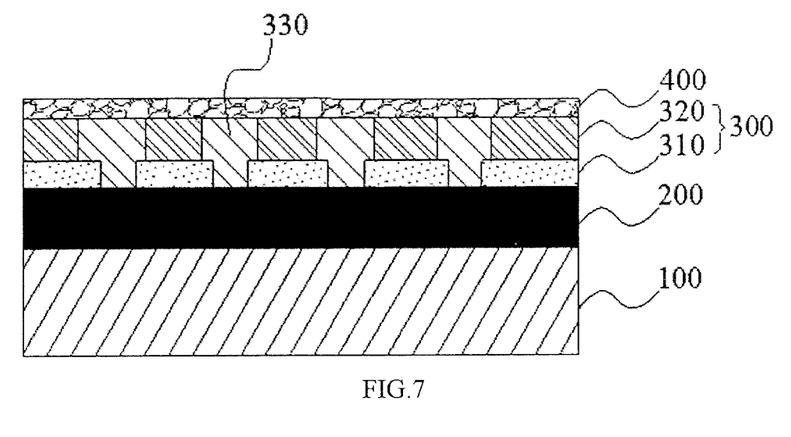
FIG. 7 shows a cross-sectional view taken along line A-A of FIG. 6.

FIG. 6 is a schematic structural view of a panel according to an embodiment of the present disclosure. As shown in FIG. 6, the embodiment discloses a panel 1000 including an intermediate region and a peripheral region surrounding the intermediate region. The panel may be a touch panel or an array substrate. When the panel is a touch panel, the intermediate region is a touch region. When the panel is an array substrate, the intermediate region is a display region. The peripheral region of the panel is provided with a bonding area structure. FIG. 7 is a cross-sectional view taken along line A-A of FIG. 6. FIG. 7 shows a cross-sectional view of the bonding area structure similar to FIGS. 1-3. As shown in FIG. 6 and FIG. 7, an index matching layer 400 is disposed on the entire surface of the panel including the bonding area structure so as to eliminate a background image generated by high reflectance of the ITO layer disposed in the intermediate region. At the bonding area structure, the index matching layer 400 is disposed on a surface of the electrode layer 300 away from the light blocking layer 200. That is, the index matching layer 400 covers the surfaces of the etch barrier 330 and the metal connection portion 320. In order to expose the metal connection 320 of the bonding area structure such that it can be electrically connected to the external circuit, the index matching layer 400 may be reacted with the etchant to expose the metal connection portion 320 of the bonding area structure. As described above, since the etch barrier 330 is disposed on the region of the light blocking layer 200 where the patterned electrode 310 is not disposed, and the etch barrier 330 does not react with the etchant, it is not necessary to strictly control the precision of the etching when the metal connection portion 320 is exposed by etching the index matching layer 400. That is, there is no need to worry that the excessive etching may damage the light blocking layer 200 to cause light leakage. The etchant reacts with the index matching layer 400 on the bonding area structure to remove the index matching layer 400 so as to expose the metal connection portion 320, thereby preventing contamination of the metal connection portion 320 caused by incomplete removal of the index matching layer 400 on the bonding area structure.

According to an embodiment of the present disclosure, in order to ensure the surface flatness of the panel, the etch barrier 330 may also cover the upper surface of the patterned electrode 310 which is not covered by the metal connection portion 320, so as to compensate for a height difference between the portion of the patterned electrode 310 covered by the metal connection portion 320 and the portion of the patterned electrode 310 not covered by the metal connection portion 320 by using the etch barrier 330. As a result, a panel with good flatness can be obtained.

In summary, the bonding area structure and the panel including the bonding area structure according to embodiments of the present disclosure have at least one of the following advantages:

The etch barrier may prevent contamination or light leakage caused by poor control of etching precision when the metal connection portion is exposed by etching the index matching layer.

The panel has a flat surface, which can prevent poor bonding due to poor surface flatness in the subsequent preparation of the touch display device.

There is no complicated positional and/or structural relationship between the various components constituting the panel, and it is only necessary to adjust the existing panel structure to obtain the panel according to an embodiment of the present disclosure, thereby facilitating reduction of production cost and facilitating the promotion and utilization of the panel.

According to an embodiment of the invention, a method of manufacturing a bonding area structure is provided, which is specifically as follows:

First, a substrate 100 is formed of glass, and a light-shielding material such as a black light-blocking resin or a metal oxide may be applied to a side of the glass substrate to form a light-blocking layer 200. The position of the light blocking layer 200 has been described in detail above and will not be described herein. Subsequently, a conductive layer, such as an ITO layer, is deposited on an upper surface of the light blocking layer 200 (a side of the light blocking layer 200 away from the glass substrate). The ITO layer is patterned by a first patterning process according to connection requirements of specific circuits of the panel having the bonding area structure to form a patterned electrode 310 having a specific pattern. Subsequently, a metal layer is deposited on the substrate where the patterned electrode 310 has been formed, and a metal connection portion 320 on the patterned electrode 310 is formed by using a second patterning process. It should be noted that, in other embodiments, the metal connection portion 320 and the patterned electrode 310 may be formed by a single patterning process, specifically, the conductive layer and the metal layer are sequentially deposited on the side of the light blocking layer away from the substrate, then, the patterned electrode 310 and the metal connection portion 320 are simultaneously formed by the single patterning process. An OCR (Over Coating Resist) is applied on the substrate where the metal connection portion has been formed, and an etch barrier 330 is formed in a region, where no patterned electrode is disposed, on a side of the light blocking layer away from the substrate by using a third patterning process. The etch barrier 330 covers at least a portion of the light blocking layer 200 exposed by the patterned electrode.

In the present disclosure, the panel includes an intermediate region and a peripheral region and the bonding area structure is located in the peripheral region. During the manufacturing process of the entire panel, the method of manufacturing the bonding area structure further includes: coating the entire panel including the bonding area structure with an index matching layer 400; removing a portion of the index matching layer 400 on the bonding area structure by a fourth patterning process to expose the metal connection portion 320. The index matching layer 400 may be formed of SiON which can react with the etchant.

In the present disclosure, the patterning process described above generally refers to a mask patterning process, and may include one or more of photoresist coating, exposure, development, etching, photoresist stripping, and the like. For example, the first, second, and fourth patterning processes include photoresist coating, exposure, development, etching, and photoresist stripping, and the third patterning process includes only exposure and development.

In the present disclosure, as mentioned above, the patterned electrode 310 and the metal connection portion 320 are simultaneously formed by the single patterning process, such as a single mask patterning process. That is, the exposure process is performed by using the single mask, and the metal layer and the conductive layer are sequentially etched by using different etching liquids to form the patterned electrode 310 and the metal connection portion 320 which are stacked and have the same pattern.

In the present disclosure, in addition to the mask patterning process described above, each of the aforementioned layers may be formed by other patterning method, such as printing or the like, so that desired pattern of each layer can be directly formed, and the manufacturing process can be simplified.

It will be understood by those skilled in the art that, the height of the etch barrier 330 can be beneficially controlled by controlling the photoresist coating process, such that the top surface of the etch barrier is coplanar with the top surface of the metal connection portion 320. In addition, when the entire panel including the bonding area structure is coated with the index matching layer 400, after the index matching layer 400 on the bonding area structure of the panel is peeled off, the bonding area structure according to an embodiment of the present disclosure can be obtained.

In another aspect of the present disclosure, the present disclosure provides a touch display device. According to an embodiment of the present disclosure, the touch display device includes a touch panel, wherein the touch panel may be the panel described above. Therefore, the touch display device has all the features and advantages of the panel described above, and details are not described herein again.

In the description of the present disclosure, the terms "an embodiment", "another embodiment" and the like mean that the specific features, structures, materials or characteristics described in connection with this embodiment are included in at least one embodiment of the present disclosure. In the present disclosure, the expressions of the above terms are not necessarily directed to the same embodiment or example. Furthermore, the particular features, structures, materials, or characteristics described may be combined in a suitable manner in any one or more embodiments or examples. Moreover, in the absence of contradiction, those skilled in the art may combine different embodiments or examples described in the disclosure and features of different embodiments or examples.

While the embodiments of the present disclosure have been shown and described above, it may be understood that the above-described embodiments are illustrative and are not to be construed as limiting the scope of the disclosure. Variations, modifications and substitutions of the above-described embodiments may be made by those skilled in the art within the scope of the present disclosure.

What is claimed is:

1. A bonding area structure, located in a peripheral region of a panel including an intermediate region and the peripheral region, the peripheral region surrounding the intermediate region, wherein the bonding area structure comprises:
   a substrate;
   a light blocking layer on a surface of the substrate;
   a patterned electrode on a side of the light blocking layer away from the substrate;
   a metal connection portion on a surface of the patterned electrode away from the light blocking layer for bonding with an external circuit; and
   an etch barrier on a side of the light blocking layer away from the substrate and at least in a region where no patterned electrode is disposed so as to cover a portion of the light blocking layer exposed by the patterned electrode,
   wherein an orthographic projection of the etch barrier on the substrate does not overlap with an orthographic projection of the metal connection portion on the substrate,
   wherein a height of the etch barrier is greater than a height of the patterned electrode adjacent to the etch barrier, and a top surface of the etch barrier is higher than a top surface of the metal connection portion,
   wherein a difference between the height of the etch barrier and the sum of the height of the patterned electrode and a height of the metal connection portion does not exceed 7% of the height of the metal connection portion.

2. The bonding area structure according to claim 1, wherein the metal connection portion exposes at least a portion of the patterned electrode to form a step between the metal connection portion and the patterned electrode, and the etch barrier covers the step.

3. The bonding area structure according to claim 1, wherein the etch barrier is formed of photoresist.

4. The bonding area structure according to claim 1, wherein the patterned electrode is a transparent electrode.

5. The bonding area structure according to claim 4, wherein the transparent electrode comprises ITO.

6. The bonding area structure according to claim 4, wherein the transparent electrode comprises a metal mesh.

7. A panel comprising the bonding area structure according to claim 1.

8. The panel according to claim 7, wherein the panel is a touch panel comprising a touch electrode, and the patterned electrode and the touch electrode are disposed in the same layer and formed of the same material.

9. A touch display device comprising the panel according to claim 8.

10. A method of manufacturing a bonding area structure, wherein the bonding area structure is located in a peripheral region of a panel including an intermediate region and the peripheral region, and the peripheral region surrounds the intermediate region of the panel,
    wherein the method comprises:
    coating a substrate with a light shielding material to form a light blocking layer;
    depositing a conductive layer on a side of the light blocking layer away from the substrate, and forming a patterned electrode by a first patterning process;
    depositing a metal layer on the substrate on which the patterned electrode is formed, and forming a metal connection portion disposed on the patterned electrode by a second patterning process; and coating the substrate on which the metal connection portion is formed with photoresist, and forming an etch barrier on a side of the light blocking layer away from the substrate and in a region where no patterned electrode is disposed by a third patterning process, the etch barrier covering at least a portion of the light blocking layer exposed by the patterned electrode, wherein an orthographic projection of the etch barrier on the substrate does not overlap with an orthographic projection of the metal connection portion on the substrate, wherein a height of the etch barrier is greater than a height of the patterned electrode adjacent to the etch barrier, and a top surface of the etch barrier is higher than a top surface of the metal connection portion, wherein a difference between the height of the etch barrier and the sum of the height of the patterned electrode and a height of the metal connection portion does not exceed 7% of the height of the metal connection portion.

11. The method according to claim 10, wherein the method further comprises:

coating the entire panel including the bonding area structure with an index matching layer; and removing a portion of the index matching layer on the bonding area structure by a fourth patterning process to expose the metal connection portion.

12. A method of manufacturing a bonding area structure, wherein the bonding area structure is located in a peripheral region of a panel including an intermediate region and the peripheral region, and the peripheral region surrounds the intermediate region of the panel, wherein the method comprises:

coating a substrate with a light shielding material to form a light blocking layer;

depositing a conductive layer and a metal layer on a side of the light blocking layer away from the substrate in sequence, and forming a patterned electrode and a metal connection portion disposed on the patterned electrode by a single patterning process; and coating the substrate on which the metal connection portion is formed with photoresist, and forming an etch barrier on a side of the light blocking layer away from the substrate and in a region where no patterned electrode is disposed by a third patterning process, the etch barrier covering at least a portion of the light blocking layer exposed by the patterned electrode, wherein an orthographic projection of the etch barrier on the substrate does not overlap with an orthographic projection of the metal connection portion on the substrate, wherein a height of the etch barrier is greater than a height of the patterned electrode adjacent to the etch barrier, and a top surface of the etch barrier is higher than a top surface of the metal connection portion, wherein a difference between the height of the etch barrier and the sum of the height of the patterned electrode and a height of the metal connection portion does not exceed 7% of the height of the metal connection portion.

13. The method according to claim 12, wherein the method further comprises:

coating the entire panel including the bonding area structure with an index matching layer; and removing a portion of the index matching layer on the bonding area structure by a fourth patterning process to expose the metal connection portion.

\* \* \* \* \*